(12) United States Patent
Kinard et al.

(10) Patent No.: US 10,433,450 B2
(45) Date of Patent: Oct. 1, 2019

(54) MOUNTING AND FASTENING MECHANISM

(71) Applicant: Gables Engineering, Inc., Coral Gables, FL (US)

(72) Inventors: Daniel Kinard, Coconut Grove, FL (US); Craig Kirsch, Key Largo, FL (US)

(73) Assignee: Gables Engineering, Inc., Coral Gables, FL (US)

( * ) Notice: Subject to any disclaimer, the term of this patent is extended or adjusted under 35 U.S.C. 154(b) by 0 days.

(21) Appl. No.: 15/648,430

(22) Filed: Jul. 12, 2017

(65) Prior Publication Data

US 2018/0020567 A1    Jan. 18, 2018

Related U.S. Application Data (60) Provisional application No. 62/361,401, filed on Jul. 12, 2016.

(51) Int. Cl.
*H05K 7/14* (2006.01)
*F16B 5/12* (2006.01)

(52) U.S. Cl.
CPC .......... *H05K 7/1417* (2013.01); *F16B 5/123* (2013.01); *H05K 7/1412* (2013.01)

(58) Field of Classification Search
CPC .. H05K 7/1417; H05K 7/1412; H05K 7/1411; H05K 7/1408; H05K 7/1409; H05K 7/183; F16B 5/123; F16B 2/10; F16B 5/125; B60K 2350/941; B60R 2011/0003

USPC ... 248/221.11, 222.51, 27.1, 222.11, 222.52, 248/220.41; 211/26, 190–192, 129.1; 361/679.43, 726

See application file for complete search history.

(56) References Cited

U.S. PATENT DOCUMENTS

| | | | | |
|---|---|---|---|---|
| 3,420,381 A * | 1/1969 | Bradfield | ................ | H05K 7/16 211/169 |
| 6,294,735 B1 * | 9/2001 | Sobel | ................... | H05K 7/1409 174/135 |
| 6,549,424 B1 * | 4/2003 | Beseth | ................. | H05K 7/1409 361/726 |
| 7,032,862 B2 * | 4/2006 | Landes | .................. | B64D 43/00 244/129.1 |
| 8,550,260 B1 * | 10/2013 | Vircks | .................. | H05K 7/1412 211/208 |
| 2013/0043359 A1 * | 2/2013 | Kirsch | ................. | H05K 7/1412 248/231.51 |

* cited by examiner

*Primary Examiner* — Christopher Garft
(74) *Attorney, Agent, or Firm* — Adam C. Underwood (57) ABSTRACT

A mounting mechanism for securing a panel to an equipment rail includes a bezel assembly and a mounting plate assembly, where the bezel assembly includes a bezel frame, a bezel internal metal plate and a pair of latch handles connected to the bezel frame by latch handle fasteners at a set of pivot points and where the mounting plate assembly includes a mounting plate, a set of spring sheets that are secured to the mounting plate by a plurality of screws and a plurality of custom quarter-turn fasteners adapted to secure the mounting plate assembly to a pair of equipment rails.

10 Claims, 13 Drawing Sheets

MOUNTING AND FASTENING MECHANISM

BACKGROUND OF THE INVENTION

Field of the Invention

The present invention relates to the field of mounting mechanisms and, more particularly to mounting mechanisms for electronics equipment.

Description of the Related Art

Dzus rails are convenient structural supports used for panels or removable parts to be fastened. They are frequently used in the various control panel structures found in a cockpit. The general mode of attachment requires securing the avionics device transversely to two parallel Dzus rails. The difficulty lies in the amount of panel front surface area occupied by the standard Dzus fasteners. Current Dzus fasteners are cylindrical, and are typically located at or near the corners of the panel front, and each fastening element is approximately 0.375" in diameter. In the case of a panel design that utilizes a single LCD display, the presence of standard Dzus fasteners inhibits the display from being positioned within approximately 0.400" of at least two sides of the panel. This greatly limits the size of display that will fit within the panel, and leaves a large portion of the panel front area unusable.

BRIEF SUMMARY OF THE INVENTION

Embodiments of the present invention address deficiencies of the art in respect to the field of mounting mechanisms and, more particularly to mounting mechanisms for electronics equipment. The mounting mechanism provides a novel and non-obvious device and method of use. In an embodiment of the invention, the mounting mechanism includes a bezel assembly and a mounting plate assembly. The bezel assembly includes a bezel frame, a bezel internal metal plate, and a pair of latch handles connected to the bezel frame by latch handle fasteners at a set of pivot points.

In an embodiment of the invention, a mounting mechanism for securing a panel to an equipment rail includes a bezel assembly and a mounting plate assembly, where the bezel assembly includes a bezel frame, a bezel internal metal plate and a pair of latch handles connected to the bezel frame by latch handle fasteners at a set of pivot points and where the mounting plate assembly includes a mounting plate, a set of spring sheets that are secured to the mounting plate by a plurality of screws and a plurality of custom quarter-turn fasteners adapted to secure the mounting plate assembly to a pair of equipment rails.

Additional aspects of the invention will be set forth in part in the description which follows, and in part will be obvious from the description, or may be learned by practice of the invention. The aspects of the invention will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The accompanying drawings, which are incorporated in and constitute part of this specification, illustrate embodiments of the invention and together with the description, serve to explain the principles of the invention. The embodiments illustrated herein are presently preferred, it being understood, however, that the invention is not limited to the precise arrangements and instrumentalities shown, wherein.

DETAILED DESCRIPTION OF THE INVENTION

Embodiments of the invention provide a mounting mechanism for securing various electronic units to a set of equipment rails. Embodiments of the present invention address deficiencies of the art in respect to the field of mounting mechanisms and, more particularly to mounting mechanisms for electronics equipment. The mounting mechanism provides a novel and non-obvious device and method of use. In an embodiment of the invention, the mounting mechanism includes a bezel assembly and a mounting plate assembly. The bezel assembly includes a bezel frame, a bezel internal metal plate, and a pair of latch handles connected to the bezel frame by latch handle fasteners at a set of pivot points.

Figure 1:
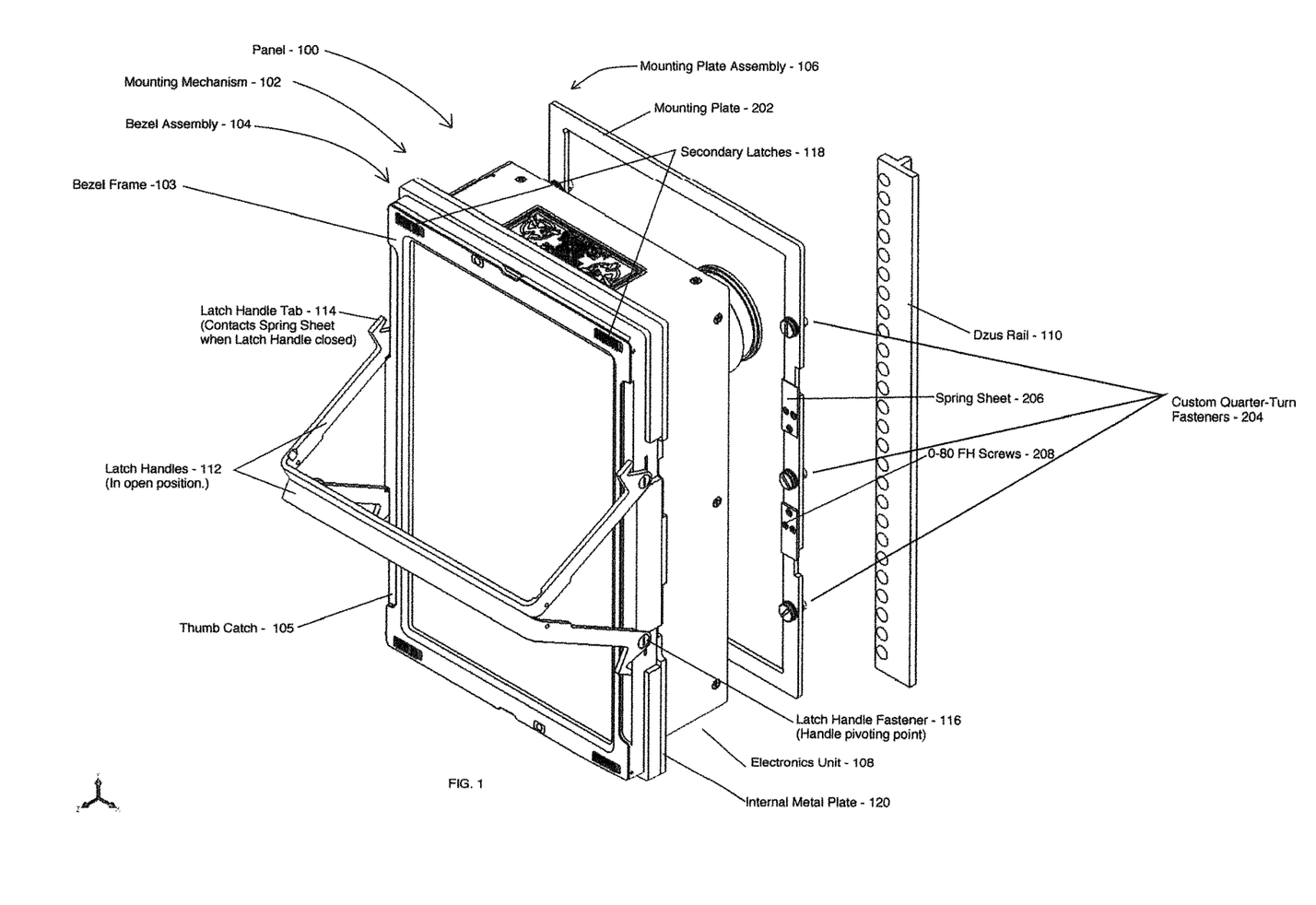
FIG. 1 is an exploded perspective view of a panel with an exemplary mounting mechanism in accordance with the present invention.

FIG. 1 is an exploded perspective view of a panel with an exemplary mounting mechanism in accordance with the present invention. Panel 100 includes a portion of the mounting mechanism 102, namely the bezel assembly 104 and the electronics unit 108. A second portion of the mounting mechanism 102, namely the mounting plate assembly 106 attaches to a pair of electronic equipment mounting rails 110, typically referred to as Dzus rails, using a plurality of custom quarter-turn fasteners 204. In one embodiment, the mounting plate assembly 106 includes a mounting plate 202, a set of mounting features referred to as spring sheets 206 that are secured to the mounting plate 202 by a plurality of screws 208, e.g., 0-80 Flathead screws. In FIG. 1, bezel assembly 104 includes bezel frame 103, thumb catch 105, bezel internal metal plate 120, two latch handles 112, where each latch handle 112 includes a latch handle tab 114 that contacts spring sheet 206 when the latch handle 112 is closed and two sets of secondary latches 118, where each set of secondary latches 118 operates to lock the one of the latch handles 112 into a closed position. In an embodiment, the set of secondary latches are embedded into the bezel frame 103. Latch handles 112 are attached at handle pivot points using a latch handle fastener 116.

Figure 2:
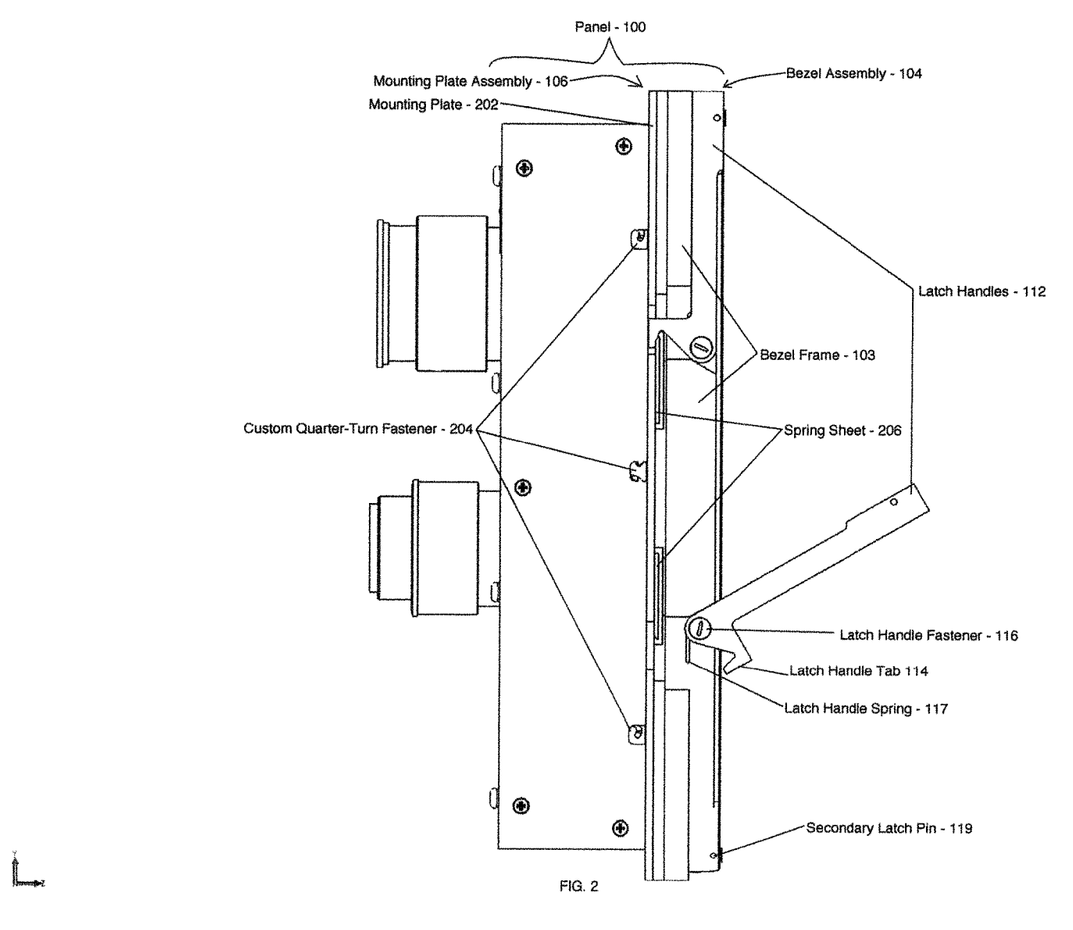
FIG. 2 is a side view of an exemplary panel in accordance with the present invention.

FIG. 2 is a side view of an exemplary panel 100 in accordance with the present invention. Panel 100 includes a portion of the mounting mechanism 102, namely the bezel assembly 104 and the electronics unit 108. A second portion of the mounting mechanism 102, namely the mounting plate assembly 106 attaches to a pair of electronic equipment mounting rails (shown in FIG. 1), typically referred to as Dzus rails, using a plurality of custom quarter-turn fasteners 204. In one embodiment, the mounting plate assembly 106 includes a mounting plate 202, a set of mounting features referred to as spring sheets 206 that are secured to the mounting plate 202 by a plurality of screws (shown in FIG. 1), e.g., 0-80 Flathead screws. In FIG. 2, bezel assembly 104 includes bezel frame 103, bezel internal metal plate 120, two latch handles 112, where each latch handle 112 includes a latch handle tab 114 that contacts spring sheet 206 when the latch handle 112 is closed and two sets of secondary latches (shown in FIG. 1), where each set of secondary latches (shown in FIG. 1) operates to lock the one of the latch handles 112 into a closed position. Latch handles 112 are attached at handle pivot points using a latch handle fastener 116. At each of the handle pivot points, a latch handle spring 117 is provided and secured by the latch handle fastener 116. Latch handle springs 117 function to send the latch handles 112 towards an open position once the secondary latches are disengaged.

Figure 3:
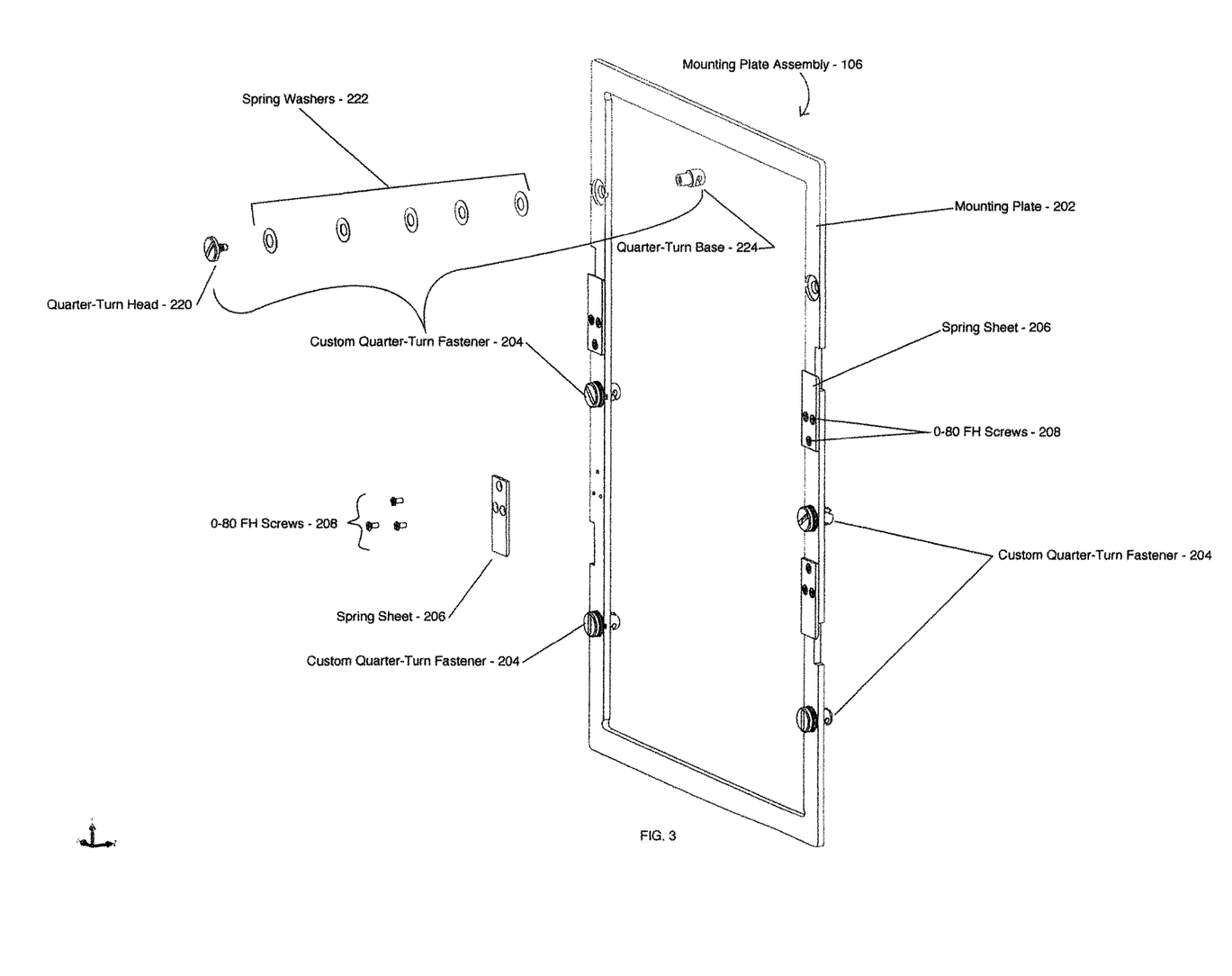
FIG. 3 is an exploded perspective view of a mounting plate assembly of the mounting mechanism in accordance with the present invention.
Figure 3A:
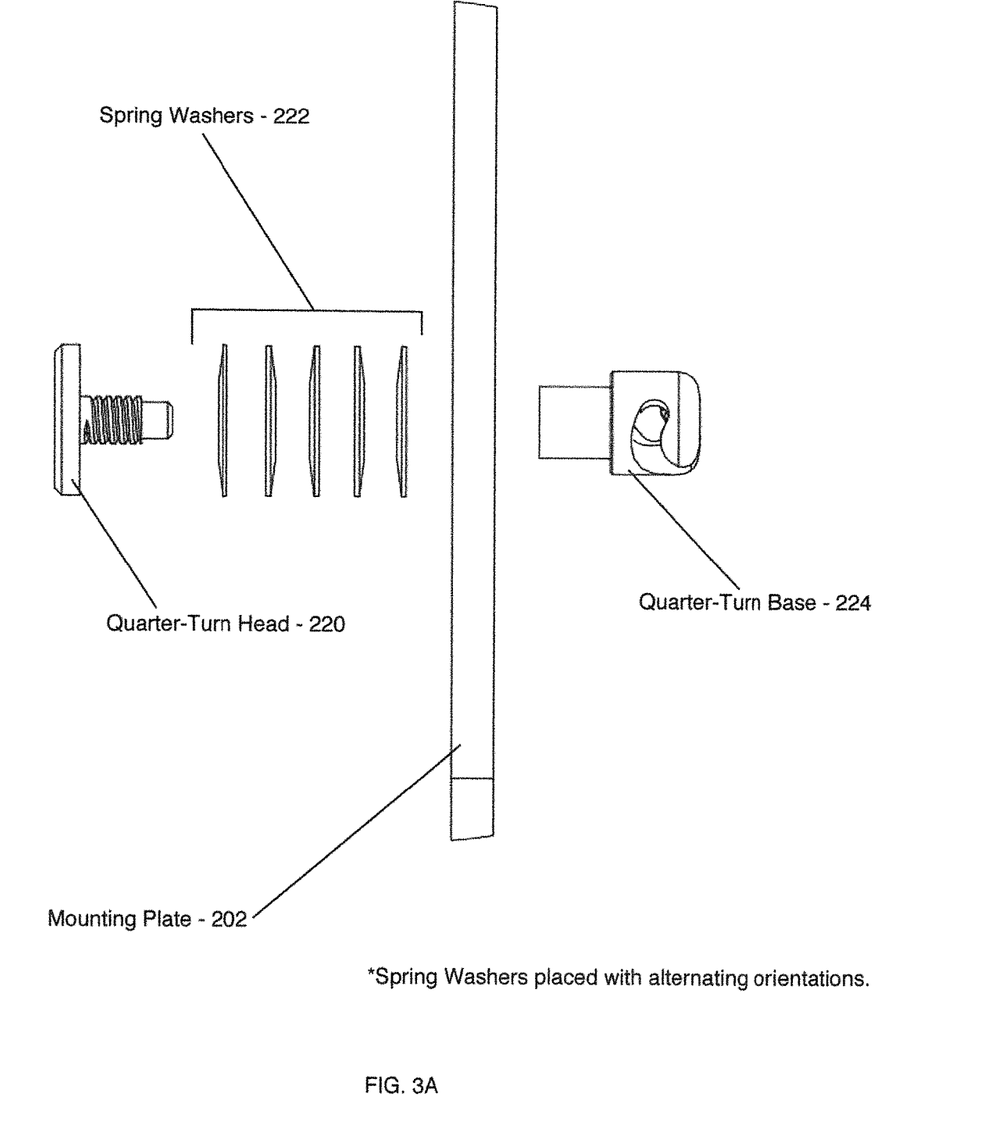
FIG. 3A is an exploded view of an exemplary quarter-turn fastener in accordance with the present invention.

FIG. 3 is an exploded perspective view of a mounting plate assembly 106 of the mounting mechanism 102 in accordance with the present invention. Mounting plate assembly 106 attaches to a pair of electronic equipment mounting rails (shown in FIG. 1), typically referred to as Dzus rails, using a plurality of custom quarter-turn fasteners 204. In one embodiment, the mounting plate assembly 106 includes a mounting plate 202, a set of mounting features referred to as spring sheets 206 that are secured to the mounting plate 202 by a plurality of screws 208, e.g., 0-80 Flathead screws. In FIG. 3A, an exploded view of an exemplary quarter-turn fastener 204 in accordance with the present invention is illustrated. As shown in FIG. 3A, the exemplary quarter-turn fastener 204 includes a plurality of curved spring washers 222, arranged in alternating orientations and placed in a stack. The spring washers 222 have a conical shape, with an obtuse angle of approximately 8 degrees, although this angle is arbitrary. These washers are stacked atop one another, with their orientation being alternated. As a result, the potential travel of the spring washers 222 is the sum of each individual washer's potential travel. The spring washers 222 are partially compressed towards a flat position when the custom quarter turn fastener 204 engages the Dzus rails. Thus, the custom quarter turn fastener 204 behaves similarly to a standard Dzus fastener.

The custom quarter turn fastener 204 applies similar tension to the Dzus rail when engaged, and can properly fasten to a Dzus rail over a similar range of tolerances. The decision to use spring washers 222 allows for a custom quarter turn fastener 204 to have similar travel to a standard Dzus fastener, but significantly less height. This is a highly desirable feature, as the bezel assembly 104 is positioned in front of the mounting plate assembly 106, so any reduction of height of the mounting plate assembly 106 and its components transfers directly to a reduction of the overall height of panel 100.

Figure 12:
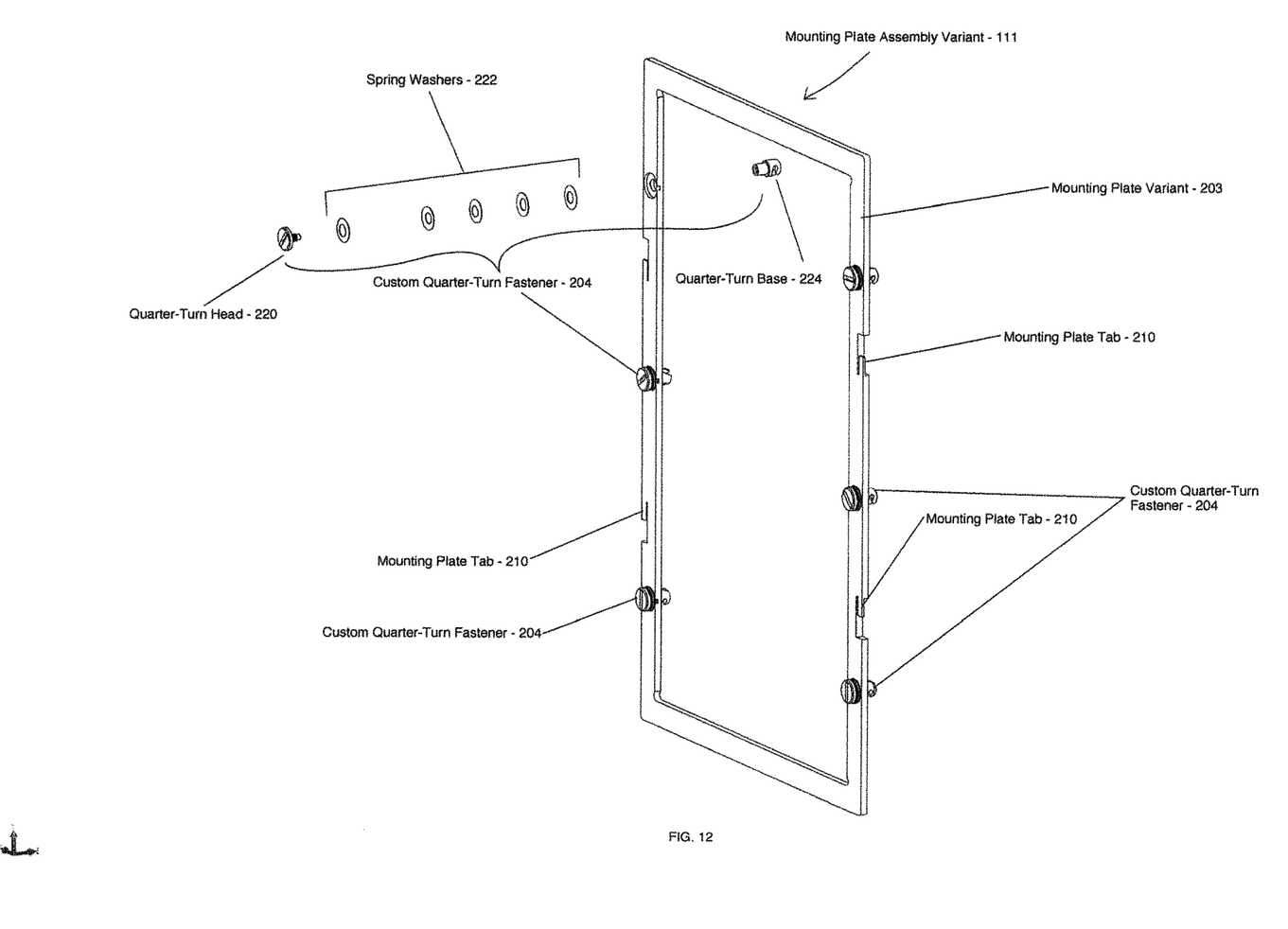

In another embodiment, FIG. 12 is an exploded perspective view of a mounting plate assembly variant 111 of the mounting mechanism 102 in accordance with the present invention. Mounting plate assembly variant 111 attaches to a pair of electronic equipment mounting rails (shown in FIG. 1), typically referred to as Dzus rails, using a plurality of custom quarter-turn fasteners 204. In one embodiment, the mounting plate assembly variant 111 includes a mounting plate variant 203, a set of mounting features referred to as mounting plate tabs 210 that are a physical component of the aforementioned mounting plate variant 203.

Figure 4:
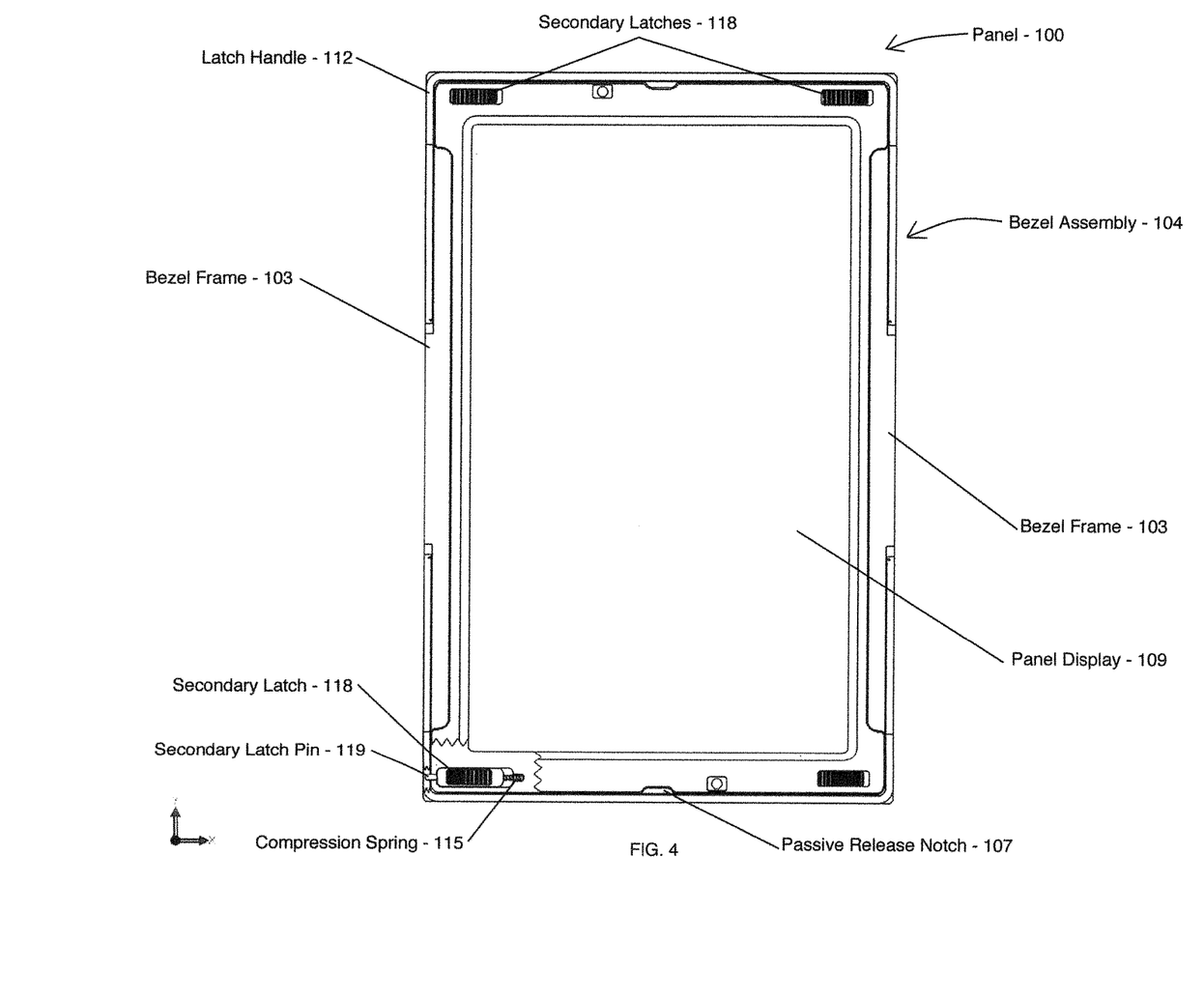
FIG. 4 is a front plan view of an panel with an exemplary bezel assembly of a mounting mechanism in accordance with the present invention with a cutaway portion of a secondary latch.

FIG. 4 is a front plan view of a panel 100 with an exemplary bezel assembly 104 of mounting mechanism 102 in accordance with the present invention illustrating a cutaway portion of a secondary latch 118. Panel 100 includes a portion of the mounting mechanism 102, namely the bezel assembly 104. Bezel assembly 104 includes bezel frame 103, a pair of latch handle 112 pivotally mounted to the bezel frame 103, two sets of secondary latches 118, a passive release notch 107 and a panel display 109. The cutaway on the bottom left corner shows a secondary latch 118 that includes a secondary latch pin 119 and a compression spring 115. The passive release notch 107 allows for the latch handles 112 to be pried into an open position with the use of a common tool, such as a flathead screwdriver, which ensures that the panel 100 can always be disengaged and removed from mounting plate assembly 106 in the event a panel 100 is stuck.

Figure 5:
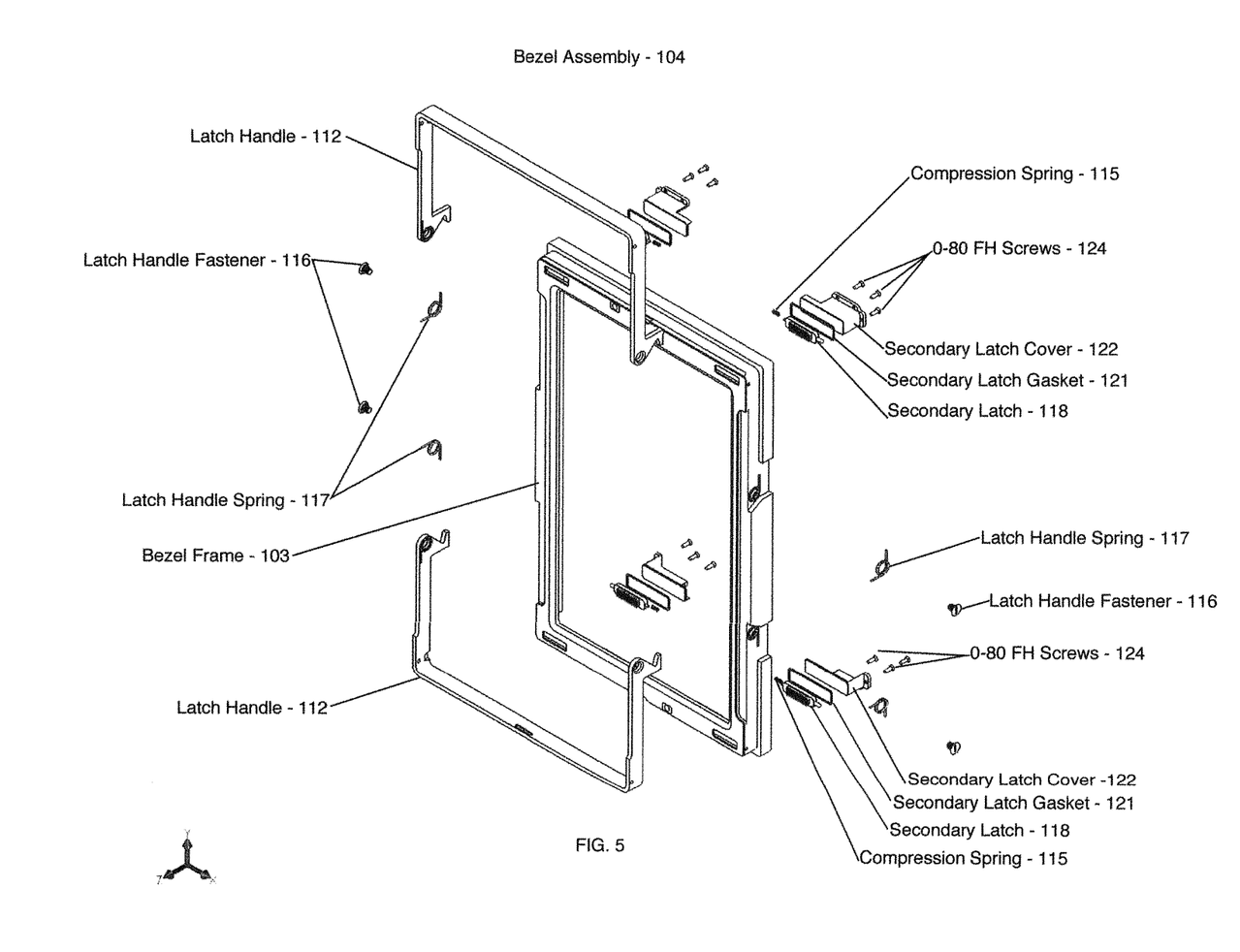
FIG. 5 is an exploded perspective view of a bezel assembly of the mounting mechanism in accordance with the present invention.

FIG. 5 is an exploded perspective view of a bezel assembly 104 of the mounting mechanism 102 in accordance with the present invention. The bezel assembly 104 of FIG. 4 is exploded to further illustrate the components of the secondary latches 118. As illustrated by FIG. 5, each of the secondary latches 118 can include a compression spring 115, a secondary latch gasket 121, a secondary latch cover 122 and a plurality of screws 124 to mount the secondary latches 118 to the bezel frame 103. In addition, FIG. 5 illustrates the latch handle springs 117 and latch handle fasteners 116.

Figure 6:
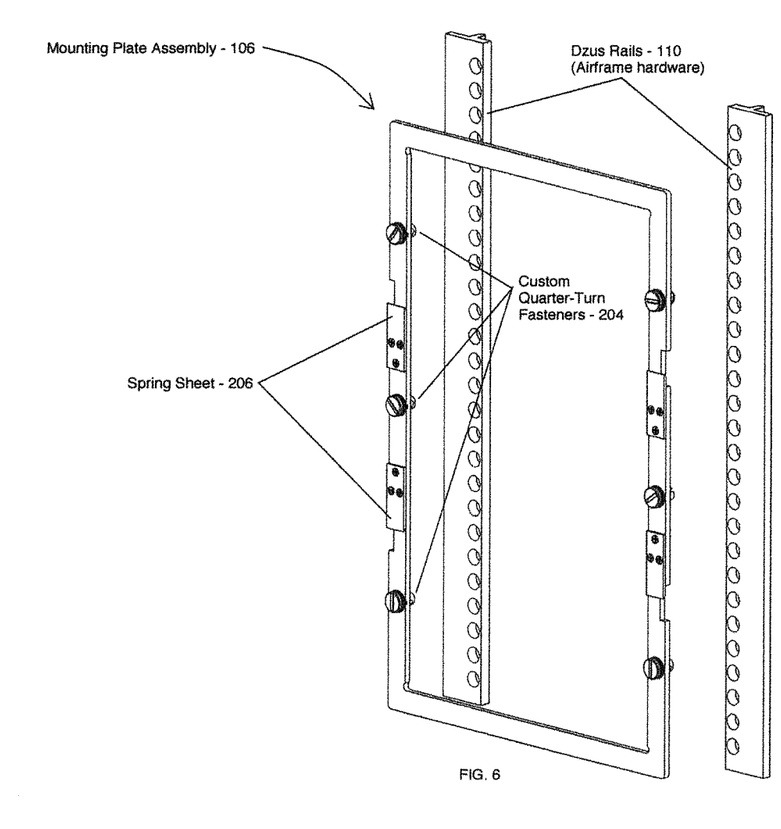
FIG. 6 is an perspective view of a mounting plate assembly of the mounting mechanism with respect to a pair of mounting rails in accordance with the present invention.

FIG. 6 is a perspective view of a mounting plate assembly 106 of the mounting mechanism 102 with respect to a pair of mounting rails 110 in accordance with the present invention.

Figure 7:
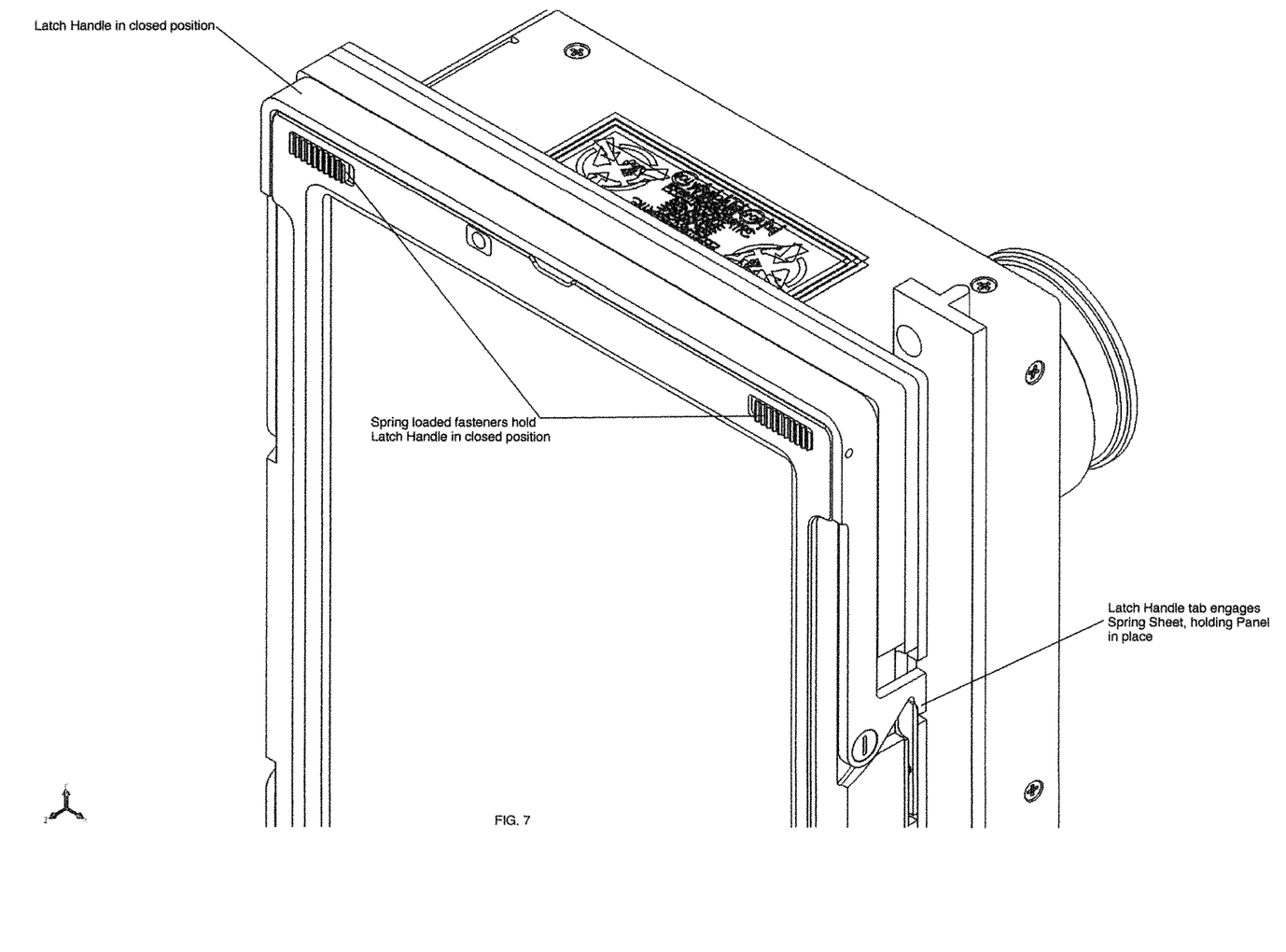
FIG. 7 is a perspective view of an exemplary panel in a locked position with the frame rails in accordance with the present invention.

FIG. 7 is a perspective view of an exemplary panel 100 in a locked position with the frame rails 110 in accordance with the present invention.

Figure 8:
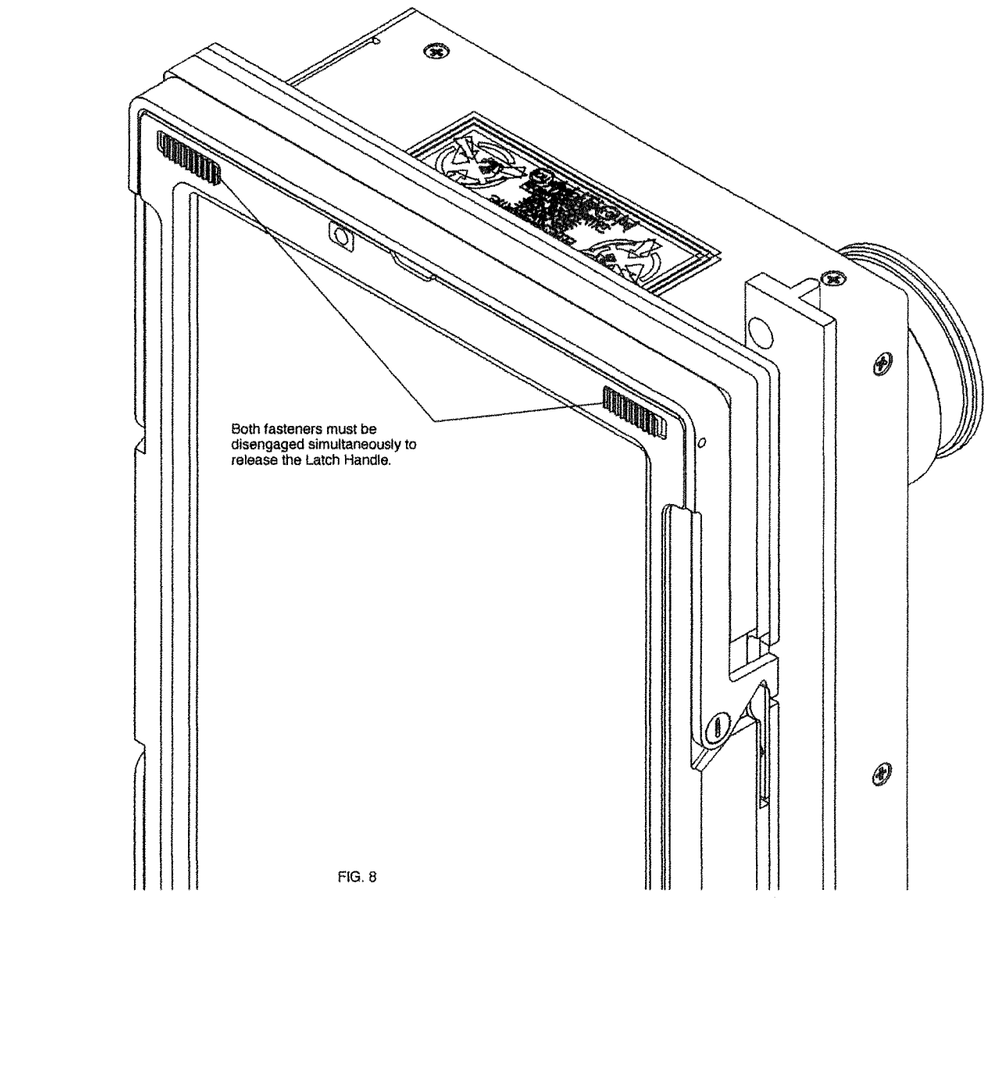
FIG. 8 is a perspective view of an exemplary panel where the secondary fasteners are disengaged simultaneously to unlock the latch handle in accordance with the present invention.

FIG. 8 is a perspective view of an exemplary panel 100 where the secondary fasteners 118 are disengaged simultaneously to unlock the latch handle 112 in accordance with the present invention.

Figure 9:
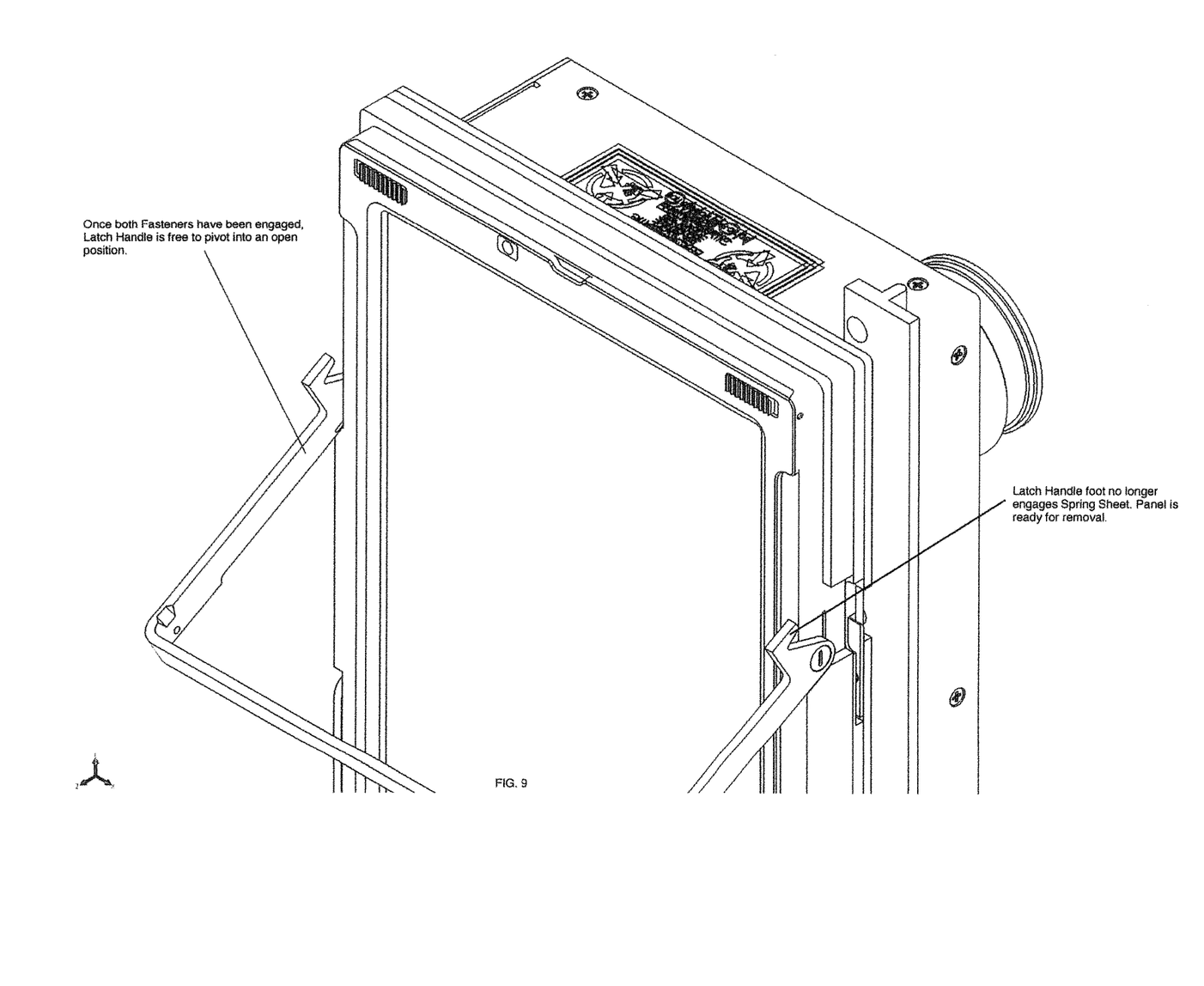
FIG. 9 is a perspective view of an exemplary panel in an unlocked position with the frame rails in accordance with the present invention.

FIG. 9 is a perspective view of an exemplary panel 100 in an unlocked position with the frame rails 110 in accordance with the present invention.

Figure 10:
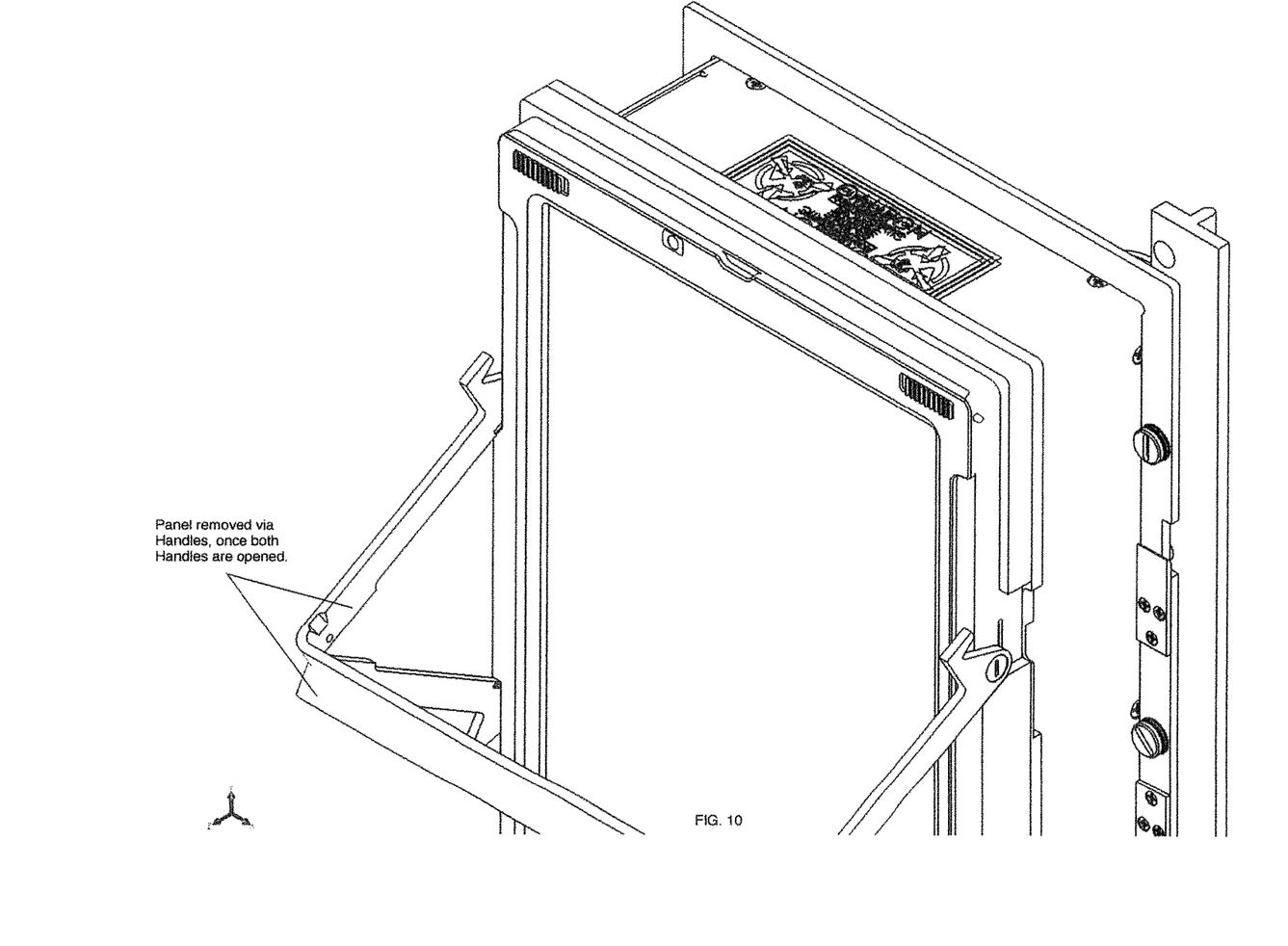
FIG. 10 is a perspective view of an exemplary panel being removed from the frame rails in accordance with the present invention.

FIG. 10 is a perspective view of an exemplary panel 100 being removed from the frame rails 110 in accordance with the present invention.

Figure 11:
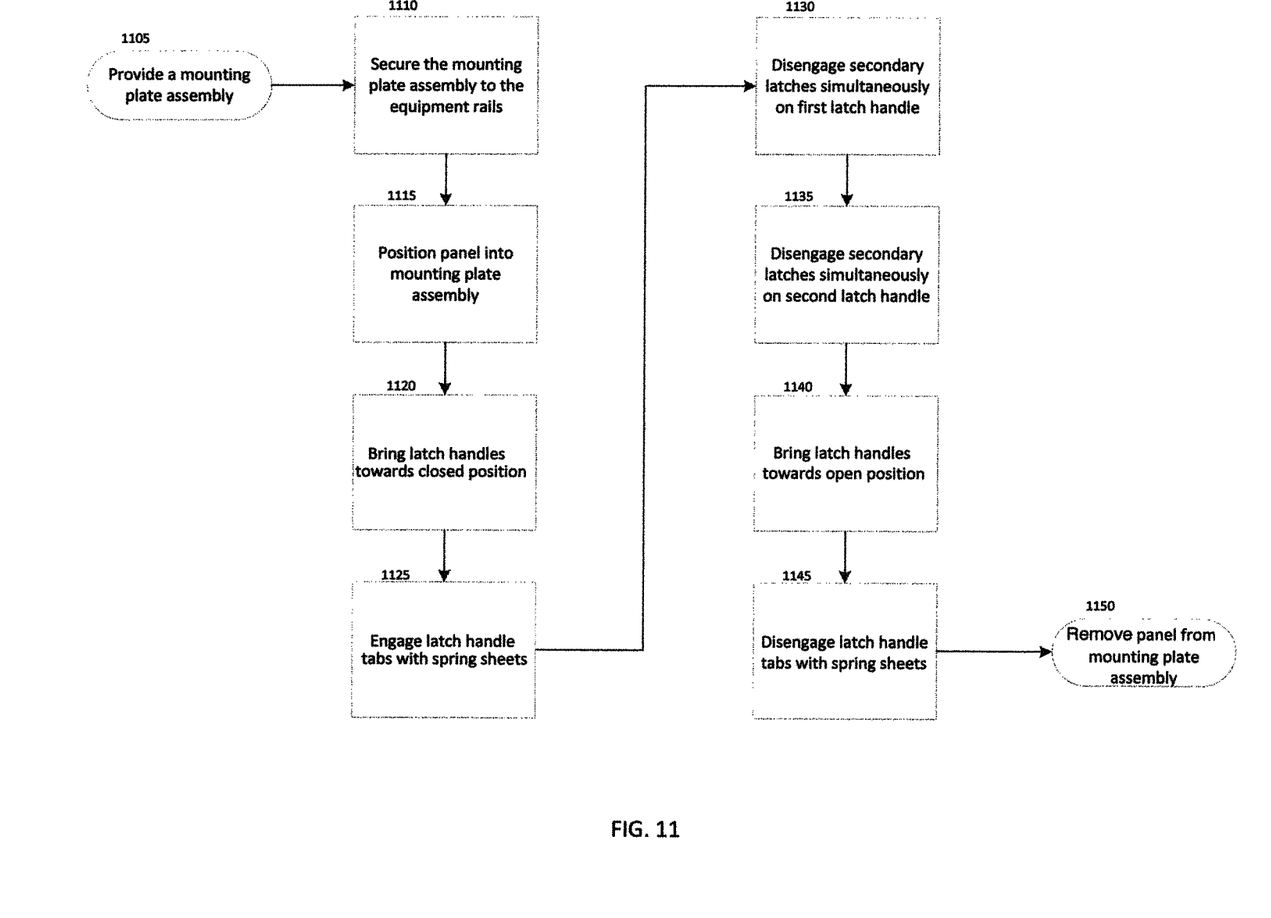
FIG. 11 is a flowchart of a method according to an embodiment of the present invention; and, FIG. 12 is an exploded perspective view of a mounting plate assembly variant of the mounting mechanism in accordance with the present invention.

In illustration of a method of use of the mounting mechanism 102 with reference to FIGS. 7-10, a method is provided in FIG. 11. In block 1105, a stand-alone mounting plate assembly 106 that acts as an adapter to allow a panel 100 to be secured indirectly to the aircraft frame via equipment rails 110 is provided. In block 1110, the mounting plate assembly 106 is secured to the Dzus rails 110 via several custom quarter-turn fasteners 204. The mounting plate assembly 106 then has additional mounting features, e.g., spring sheets 206 and/or mounting plate tabs 210, to which the panel 100 engages via a pair of latching handles 112 with latch handle tab 114. In block 1115, position the panel 100 into the mounting plate assembly 106. In block 1120, a latch handle 112 is brought towards a closed position. In block 1125, engage a latch handle tab 114 with a spring sheet 206. The panel 100 is now securely mounted onto the equipment rails 110. The method can be continued by removing a panel 100 from the equipment rails 110. In block 1130, the secondary latches 118 can be operated simultaneously to release a first latch handle. In block 1135, the secondary latches 118 can be operated simultaneously to release a second latch handle. Next, in block 1140, the latch handles 112 can be swung towards an open position. In block 1145, the latch handle tabs 114 will disengage the spring sheets 206 or mounting plate tabs 210 as the latch handles 112 are swung towards open positions. Now, in block 1150, the panel 100 can be withdrawn or removed from the mounting plate assembly 106.

Finally, the terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having thus described the invention of the present application in detail and by reference to embodiments thereof, it will be apparent that modifications and variations are possible without departing from the scope of the invention.

We claim:

1. A mounting mechanism for securing a panel to an equipment rail, the mounting mechanism comprising:
    a bezel assembly and a mounting plate assembly, wherein the bezel assembly includes a bezel frame, a bezel internal metal plate and a pair of latch handles connected to the bezel frame by latch handle fasteners at a set of pivot points;
    wherein the mounting plate assembly includes a mounting plate, a set of spring sheets that are secured to the mounting plate by a plurality of screws; and
    a plurality of custom quarter-turn fasteners adapted to secure the mounting plate assembly to the equipment rail.

2. The mounting mechanism of claim 1, further comprising:
    a set of secondary latches, wherein the set of secondary latches operates to lock one of the pair of latch handles in a closed position.

3. The mounting mechanism of claim 2, wherein the set of secondary latches are embedded into the bezel frame.

4. The mounting mechanism of claim 1, wherein one of the plurality of custom quarter-turn fasteners includes a plurality of curved spring washers.

5. The mounting mechanism of claim 4, wherein the plurality of curved spring washers are arranged in alternating orientations and placed in a stack.

6. A mounting mechanism for securing a panel to a pair of equipment rails, the mounting mechanism comprising:
    a bezel assembly and a mounting plate assembly, wherein the bezel assembly includes a bezel frame, a bezel internal metal plate and a pair of latch handles connected to the bezel frame by latch handle fasteners at a set of pivot points;
    wherein the mounting plate assembly includes a mounting plate, a set of spring sheets that are secured to the mounting plate by a plurality of screws; and
    a plurality of custom quarter-turn fasteners adapted to secure the mounting plate assembly to the pair of equipment rails.

7. The mounting mechanism of claim 6, further comprising:
    a set of secondary latches, wherein the set of secondary latches operates to lock one of the pair of latch handles in a closed position.

8. The mounting mechanism of claim 7, wherein the set of secondary latches are embedded into the bezel frame.

9. The mounting mechanism of claim 6, wherein one of the plurality of custom quarter-turn fasteners includes a plurality of curved spring washers.

10. The mounting mechanism of claim 9, wherein the plurality of curved spring washers are arranged in alternating orientations and placed in a stack.

* * * * *